United States Patent [19]
Jacobi

[11] Patent Number: 5,868,582
[45] Date of Patent: Feb. 9, 1999

[54] CONTACT DEVICE FOR ELECTRICALLY CONNECTING A PRINTED CIRCUIT BOARD WITH A LIQUID CRYSTAL DISPLAY

[75] Inventor: Wolfgang Jacobi, München, Germany

[73] Assignee: Otto Dunkel GmbH Fabrik fur Elektrotechnische Gerate, Muhldorf, Germany

[21] Appl. No.: 886,513

[22] Filed: Jul. 1, 1997

[30] Foreign Application Priority Data

Jul. 1, 1996 [DE] Germany .................. 196 26 377.8

[51] Int. Cl.⁶ ..................................................... H01R 9/09
[52] U.S. Cl. ................................................................ 439/74
[58] Field of Search .................. 439/74, 71, 73, 439/66, 62

[56] References Cited

U.S. PATENT DOCUMENTS

| | | | |
|---|---|---|---|
| 4,060,889 | 12/1977 | Zielinski | 439/67 |
| 4,527,848 | 7/1985 | Velsher et al. | 439/62 |
| 4,639,062 | 1/1987 | Taniguchi et al. | 439/66 |
| 4,738,625 | 4/1988 | Burton et al. | 439/66 |
| 5,704,793 | 1/1998 | Stokoe et al. | 439/62 |

*Primary Examiner*—Neil Abrams
*Assistant Examiner*—T. C. Patel
*Attorney, Agent, or Firm*—Jacobson, Price, Holman & Stern, PLLC

[57] ABSTRACT

An improved contact device uses a connector module (1) of U-shaped cross-section to electrically connect a liquid crystal display or other flat panel (4) with edge contacts to a printed circuit board (7). Lower cost and reduced profile height are achieved in that the contact elements (6) of the connector module are in direct electrical contact with corresponding conductors on the printed circuit board, and the topside of the connector module is lined with a soft elastomer layer (12).

3 Claims, 1 Drawing Sheet

CONTACT DEVICE FOR ELECTRICALLY CONNECTING A PRINTED CIRCUIT BOARD WITH A LIQUID CRYSTAL DISPLAY

BACKGROUND OF THE INVENTION

1. Field of the Invention

The present invention relates to a contact device for electrically connecting a printed circuit board with a flat panel which itself may be in the form of another printed circuit board or, in the preferred configuration, in the form of a liquid crystal display (LCD), through a, connector module of approximately U-shaped cross-section holding the edge of the panel between the legs of the U. The panel has a plurality of contact pads on its edge, and the inside of the first leg of the connector module has a corresponding array of contact elements which connect with the contact pads on the panel when the latter is inserted and which, on the outside of the second leg, connect to corresponding contact traces on the surface of the printed circuit board.

2. Description of the Related Art

In known contact devices of this kind, which are used particularly in handheld cellular telephones with LCD displays, it is necessary to interpose a so-called zebra connector between the contact elements extending on the outside of the second leg and the surface portion of the printed circuit board where the contact traces are located. A zebra connector is a block consisting of sandwiched alternating layers of conducting and non-conducting elastomeric material. Through the conducting layers of the zebra block, a satisfactory connection of the contact elements of the connector module with the contact traces on the printed circuit board is achieved even in case that the LCD panel and the printed circuit board should be joined in a slightly misaligned condition. In particular, the elastically pliable zebra block provides a reliable contact even in case that the plane of the LCD panel in its inserted position should not be absolutely parallel to the printed circuit board but rather enclosing a small angle of a few degrees with the latter.

Particularly under confined spatial conditions inside the enclosure of handheld cellular telephones, the height of this contact device has proven to be a great disadvantage. In addition, there is the required costly expenditure due to the necessity of interposing the elastic zebra connector block.

SUMMARY OF THE INVENTION

Departing from this state of the art, the object of this invention is to further develop the contact device of the kind that was named at the beginning, with the aim of achieving a design that is less complicated and therefore less expensive to manufacture, and which can be made in a more compact configuration, if necessary, while still allowing the LCD panel to be at an angle of several degrees to the printed circuit board and, in addition, improving the conductivity for electrical signals.

The inventive contact device wherein this problem is solved is distinguished in essence by the fact that the contact elements which extend over the outside of the second leg are in direct contact with the contact traces on the printed circuit board and that the connector module has a layer of soft elastomeric material on the outside of the leg that carries the linear array of contact elements on its inside. The device thus has one component less, and one contact interface is omitted, which makes the circuit continuity more reliable. When a contact device of this kind is pressed tight against the printed circuit board and, through pressure on the elastomer layer, the extensions of the contact elements are held in firm contact against the contact traces of the printed circuit board, then a slight slant of the LCD panel relative to the printed circuit board will put the connector module into a correspondingly skewed position, because as a result of the uneven pressure the elastomer layer will be compressed, and thereby deformed, unevenly. Thus, the elastomer layer serves to compensate for tolerances of shape and position.

In this, it has proven to be an advantageous design if the first leg of the U-shaped connector module, below the portion which carries the soft elastomer layer, has openings through which the linearly arrayed contact elements extend into the area of the contact pads on the flat panel.

It serves to facilitate the assembly process if, for accurate positioning, the U-shaped connector module is set inside a matching cutout of a positioning plate which is mounted on the printed circuit board.

As a further refinement, it is beneficial if the first leg of the U-shaped connector module has a ledge that extends over part of its length and supports the panel by its edge opposite the surface where the contact pads are located.

BRIEF DESCRIPTION OF THE DRAWING

Additional details, advantages, and characteristic features of the invention will be pointed out in the following description which relates to the attached drawing.

DETAILED DESCRIPTION OF THE PREFERRED EMBODIMENT

Figure 1:
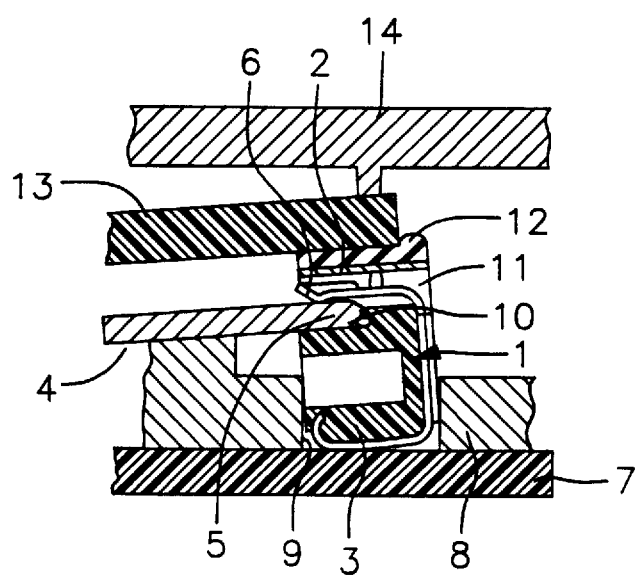
FIG. 1 is a schematic cross-sectional view of the contact device in accordance with the preferred embodiment of the invention.

As can be seen in FIG. 1, the contact device comprises a connector module 1 of U-shaped cross-section, which holds between its legs 2 and 3 a liquid crystal display panel 4 (LCD, for short), more specifically, the edge portion 5 of the panel that is occupied by a plurality of contact pads that are not specified in detail. Corresponding to the connector pads, the upper, first leg 2 of connector module 1 has on its inside a plurality of linearly arrayed contact elements 6. They are in contact with the connector pads of the LCD panel 4 when the latter is inserted. The contact elements 6 extend to the outside of the second leg 3 of the connector module 1 where they make contact with the contact traces of a printed circuit board 7 which are not shown in detail. Mounted on the printed circuit board 7 is a positioning plate 8 which has a cutout 9 matching the dimensions of the connector module 1 which serves to secure the correct position of connector module 1.

As further shown in FIG. 1, the first leg 2 of Lhe U-shaped connector module 1 has a ledge 10 that extends over part of its length and supports the LCD panel 4 by its edge opposite the surface where the contact pads are located.

Further, the first, upper leg 2 has openings 11 through which the linearly arrayed contact elements 6 extend into the area of the contact pads on the LCD panel. On the outside of the upper leg 2, the U-shaped connector module 1 is lined with a layer of soft elastomeric material 12 which supports a clear acrylic plate 13, so that the edge portion of the latter, through the elastomer layer 12, is clamped tight between the upper leg 2 of the U-shaped connector module 1 and a housing cover 14, for example the closed upper part of the housing of a handheld cellular telephone.

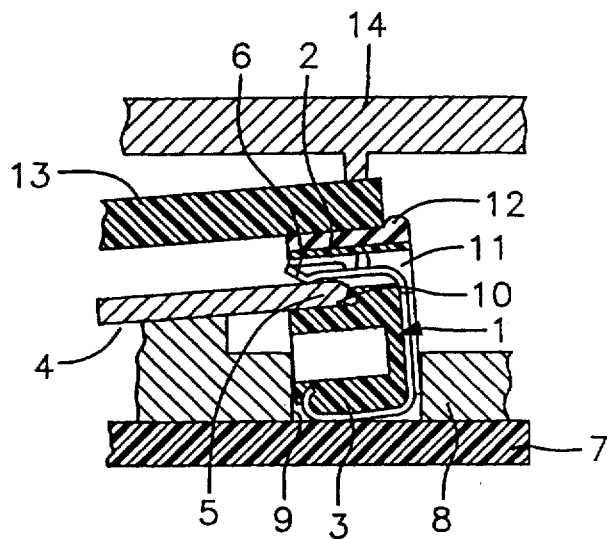

I claim:

1. A contact device for electrically connecting a printed circuit board with a flat panel that extends parallel to the printed circuit board by a connector module of U-shaped cross-section holding an edge of the flat panel between first and second legs; the flat panel having a plurality of contact pads on the edge, and the inside of the first leg of the connector module having a corresponding plurality of linearly arrayed contact elements which connect with the contact pads on the flat panel when the panel is inserted and which extend to the outside of the second leg, providing a connection to corresponding contact traces on the surface of the printed circuit board, the improvements comprising:

a) the contact elements which extend on the outside of the second leg are in direct contact with the contact traces on the printed circuit board, b) a soft elastomer layer on the outside of the first leg that carries the linearly arrayed contact elements on its inside, and c) openings located at the first leg of the U-shaped connector module below the portion which carries the soft elastomer layer, the linearly arrayed contact elements extending through the openings into an area of the contact pads on the flat panel.

2. The contact device according to claim 1, wherein the U-shaped connector module, for accurate positioning, set inside a dimensionally matched cutout of a positioning plate which is mounted on the printed circuit board.

3. The contact device according to claim 1, wherein the first leg of the U-shaped connector module has a ledge that extends over part of its length and supports the flat panel by its edge opposite the surface there the contact pads are located.

* * * * *

UNITED STATES PATENT AND TRADEMARK OFFICE
CERTIFICATE OF CORRECTION

PATENT NO.   : 5,868,582  
DATED        : Feb. 9, 1999  
INVENTOR(S)  : Wolfgang Jacobi Page 1 of 3

It is certified that error appears in the above-identified patent and that said Letters Patent is hereby corrected as shown below:

The title page, should be deleted to be replaced with the attached title page.

The drawing sheet, consisting of Fig. 1, should be deleted to be replaced with the drawing sheet, consisting of Fig. 1, as shown on the attached page.

Signed and Sealed this

Seventeenth Day of August, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,868,582        Page 2 of 3
DATED     : February 9, 1999
INVENTOR(S) : Wolfgang JACOBI It is certified that error appears in the above-identified patent and that said Letters Patent is hereby corrected as shown below:

Figure 1, change the cross-hatching of 2 as follows:

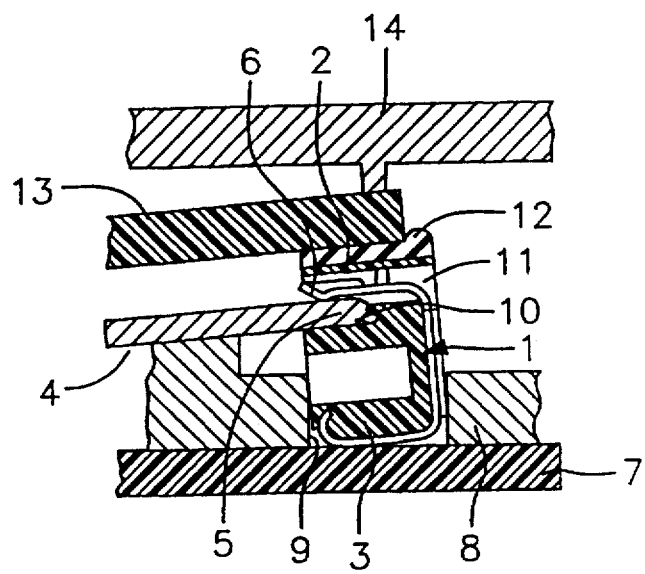

FIG. 1

United States Patent [19]

Jacobi

[11] Patent Number: 5,868,582
[45] Date of Patent: Feb. 9, 1999

[54] CONTACT DEVICE FOR ELECTRICALLY CONNECTING A PRINTED CIRCUIT BOARD WITH A LIQUID CRYSTAL DISPLAY

[75] Inventor: Wolfgang Jacobi, München, Germany

[73] Assignee: Otto Dunkel GmbH Fabrik fur Elektrotechnische Gerate, Muhldorf, Germany

[21] Appl. No.: 886,513

[22] Filed: Jul. 1, 1997

[30] Foreign Application Priority Data

Jul. 1, 1996 [DE] Germany .................. 196 26 377.8

[51] Int. Cl.[6] .................................................. H01R 9/09
[52] U.S. Cl. ............................................................ 439/74
[58] Field of Search .................................. 439/74, 71, 73, 439/66, 62

[56] References Cited

U.S. PATENT DOCUMENTS

| | | | |
|---|---|---|---|
| 4,060,889 | 12/1977 | Zielinski | 439/67 |
| 4,527,848 | 7/1985 | Velsher et al. | 439/62 |
| 4,639,062 | 1/1987 | Taniguchi et al. | 439/66 |
| 4,738,625 | 4/1988 | Burton et al. | 439/66 |
| 5,704,793 | 1/1998 | Stokoe et al. | 439/62 |

*Primary Examiner*—Neil Abrams
*Assistant Examiner*—T. C. Patel
*Attorney, Agent, or Firm*—Jacobson, Price, Holman & Stern, PLLC

[57] ABSTRACT

An improved contact device uses a connector module (1) of U-shaped cross-section to electrically connect a liquid crystal display or other flat panel (4) with edge contacts to a printed circuit board (7). Lower cost and reduced profile height are achieved in that the contact elements (6) of the connector module are in direct electrical contact with corresponding conductors on the printed circuit board, and the topside of the connector module is lined with a soft elastomer layer (12).

3 Claims, 1 Drawing Sheet